United States Patent
Kamath et al.

(10) Patent No.: US 7,116,555 B2
(45) Date of Patent: Oct. 3, 2006

(54) ACOUSTIC AND THERMAL ENERGY MANAGEMENT SYSTEM

(75) Inventors: Vinod Kamath, Raleigh, NC (US); Beth Frayne Loebach, Raleigh, NC (US); Albert Vincent Makley, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 308 days.

(21) Appl. No.: 10/747,569

(22) Filed: Dec. 29, 2003

(65) Prior Publication Data

US 2005/0141194 A1    Jun. 30, 2005

(51) Int. Cl.
H05K 7/20 (2006.01)

(52) U.S. Cl. .............. 361/696; 361/695; 361/687; 361/719; 165/80.3; 174/16.3

(58) Field of Classification Search .......... 361/687, 361/689, 690–695, 696–704, 708–710; 165/80.3, 165/80.4, 104.21, 104.26, 104.33; 257/706–710, 257/714–715, 718–719; 62/259.2; 454/184; 174/15.1, 16.1, 16.3; 700/275–278, 299–300
See application file for complete search history.

(56) References Cited

U.S. PATENT DOCUMENTS

| | | | | |
|---|---|---|---|---|
| 4,446,916 A | * | 5/1984 | Hayes .................... | 165/185 |
| 4,479,383 A | * | 10/1984 | Bravenec ................ | 73/152.01 |
| 4,671,349 A | * | 6/1987 | Wolk ..................... | 165/47 |
| 5,491,610 A | * | 2/1996 | Mok et al. ............... | 361/695 |
| 5,673,176 A | | 9/1997 | Penniman et al. ........ | 361/687 |
| 5,737,171 A | * | 4/1998 | Buller et al. ............. | 361/103 |
| 6,043,980 A | | 3/2000 | Katsui .................... | 361/695 |
| 6,067,227 A | | 5/2000 | Katsui et al. ............. | 361/695 |
| 6,094,345 A | | 7/2000 | Diemunsch ............. | 361/695 |
| 6,181,556 B1 | * | 1/2001 | Allman .................. | 361/690 |
| 6,223,815 B1 | | 5/2001 | Shibasaki ............... | 165/185 |
| 6,313,994 B1 | | 11/2001 | Tantoush ................ | 361/704 |
| 6,357,515 B1 | | 3/2002 | Bhatia ................... | 165/80.3 |
| 6,359,780 B1 | | 3/2002 | McMahan et al. ....... | 361/687 |

(Continued)

FOREIGN PATENT DOCUMENTS

JP    9027690    1/1997

(Continued)

OTHER PUBLICATIONS

L. Buller et al., "High Efficiency, Through Card Thermal Enhancement," *IBM Technical Disclosure Bulletin*, vol. 34 No. 10A, Mar. 1992, pp. 150-157.

*Primary Examiner*—Michael Datskovskiy
(74) *Attorney, Agent, or Firm*—Henry "Bud" Ehrlich; Winstead, Sechrest & Minick

(57) ABSTRACT

An acoustic and thermal energy management system and method comprising a microprocessor and a thermal mass positioned at a distance from the microprocessor, the microprocessor and thermal mass being thermally connected to the microprocessor in a manner to transfer thermal energy from the microprocessor to the thermal mass. The acoustic and thermal energy management system transferring heat from the microprocessor to a thermal mass for dissipation reducing the level of heat at the microprocessor, thereby limiting the operation of or the operation level of a fan.

20 Claims, 3 Drawing Sheets

U.S. PATENT DOCUMENTS

| | | | |
|---|---|---|---|
| 6,385,046 B1 | 5/2002 | Ta et al. | 361/704 |
| 6,400,565 B1 | 6/2002 | Shabbir et al. | 361/687 |
| 6,407,916 B1 | 6/2002 | Konstad | 361/687 |
| 6,459,575 B1 | 10/2002 | Esterberg | 361/687 |
| 6,631,755 B1 * | 10/2003 | Kung et al. | 165/46 |
| 6,708,501 B1 * | 3/2004 | Ghoshal et al. | 62/3.7 |
| 6,735,499 B1 * | 5/2004 | Ohki et al. | 700/299 |
| 6,906,901 B1 * | 6/2005 | Liu | 361/103 |
| 6,935,130 B1 * | 8/2005 | Cheng et al. | 62/259.2 |
| 2002/0144811 A1 * | 10/2002 | Chou et al. | 165/236 |
| 2002/0149909 A1 | 10/2002 | Konstad et al. | |
| 2005/0174737 A1 * | 8/2005 | Meir | 361/697 |

FOREIGN PATENT DOCUMENTS

| | | |
|---|---|---|
| JP | 11067997 | 3/1999 |
| JP | 2000133976 | 5/2000 |
| JP | 2000223617 | 8/2000 |
| JP | 2000277963 | 10/2000 |
| JP | 2000269671 | 5/2001 |
| KR | 2003055742 A * | 7/2003 |

\* cited by examiner

| THERMAL MASS (GRAMS) | HEAT CAPACITY (kJoules) | TIME DELAY (min) |
|---|---|---|
| 200 | 20 | 4.5 |
| 500 | 50 | 11 |
| 1000 | 100 | 22 |

TABLE 1

ACOUSTIC AND THERMAL ENERGY MANAGEMENT SYSTEM

TECHNICAL FIELD

The present invention relates in general to heat dissipation in electronic devices and more particularly to a system for dissipating heat and reducing the acoustics of an electronic device.

BACKGROUND INFORMATION

Computer systems typically include an input/output (I/O) port, a central processing unit (CPU), a read only memory (ROM), a random access memory (RAM), and address bus, and a data bus. Computers systems may include numerous other hardware devices and software applications. Regardless of the construction of the electronic device the CPU produces large amounts of heat during operation.

It is necessary to control and maintain the operating temperatures of a computer system below certain levels to ensure performance and reliability of the computer system. Most integrated circuits have specified maximum operating temperatures above which the integrated circuit may fail or slow down as temperatures rise. Therefore the prior art systems typically provide a method and system for dissipating the heat emitted to maintain the integrity and operation of the computer system.

Prior art methods of dissipating heat commonly include a fan that promotes convection type reduction of the heat emitted by the computer system. The fan may be mounted proximate the CPU and may include a fan heat sink. The fan engages once a set temperature proximate the CPU is reached to reduce the heat of the CPU. The fan may have variable speed controls, to increase the convective air flow across the heat sink and to more quickly reduce the heat proximate the CPU.

The heat sink may be the printed circuit board or a heat exchanger such as a fin or fluid flow device positioned proximate the CPU, or other heat producing device, for substantially immediate transfer of thermal energy from the CPU and substantially immediate dissipation of the thermal energy. These prior art heat sinks require operation of the fan to reduce the temperature of and/or proximate the CPU. Utilization of the fan increase the acoustic signature of the electronic device and increases the use of energy for operation of the electronic device.

Several drawbacks are noted with these prior art cooling systems. First, many of the systems require convection cooling provided by the fan. Operation of the fan increases power consumption and the noise level of the computer system.

It is thus a desire to provide an acoustic and thermal energy management system that addresses the drawbacks of these prior art systems. It is a further desire to provide an acoustic and thermal energy management system that transfers heat from the heat sensitive and heat producing components of a computer system to a thermal mass for storage and dissipation. It is a still further desire to provide an acoustic and thermal energy management system that transfers thermal energy for storage and dissipation to a thermal mass to reduce the use of a fan, thus reducing the acoustic signature of the electronic device and reducing the use of energy.

SUMMARY OF THE INVENTION

In view of the foregoing and other considerations, the present invention relates to dissipation of heat emitted from a microprocessor and limiting of noise associated with the operation of an electronic system.

It is a benefit of the present invention to provide an acoustic and thermal energy management system that transfers heat from the heat sensitive and heat producing components of an electronic device to a thermal mass for storage and dissipation.

It is a further benefit of the present invention to provide an acoustic and thermal energy management system that transfers thermal energy for storage and dissipation to a thermal mass to reduce the use of a fan, thus reducing the acoustic signature of the electronic device and reducing the use of energy.

Accordingly, an acoustic and thermal energy management system is provided. The acoustic and thermal energy management system comprising a microprocessor, a fan positioned proximate the microprocessor operational between an on and off position upon sensing a determined temperature of thermal energy proximate the microprocessor, wherein the fan is operational when the temperature proximate the microprocessor is greater than the determined temperature and the fan is static when the temperature proximate the microprocessor is less than the determined temperature, and a thermal mass positioned at a distance from the microprocessor, the microprocessor and thermal mass being thermally connected in a manner to transfer thermal energy from the microprocessor to the thermal mass.

The acoustic and thermal energy management system transfers heat generated by the microprocessor to a thermal mass. In a typical microprocessor application the transfer of heat eliminates the need to operate a microprocessor fan or at least reduce the operation level of a microprocessor fan. Elimination of the use of a fan or reduction of the level of operation of the fan during a microprocessor operation reduces the acoustic level of the device and reduces the energy required for operation.

A method of cooling a microprocessor is provided comprising the steps of providing: a motherboard, a microprocessor connected to the motherboard, a heat sink positioned proximate the microprocessor, a fan positioned proximate the microprocessor and functionally connected to the heat sink, the fan operational between an on and off position upon sensing a determined temperature of thermal energy proximate the microprocessor, wherein the fan is operational when the temperature proximate the microprocessor is greater than the determined temperature and the fan is static when the temperature proximate the microprocessor is less than the determined temperature, the fan being operational at various speed levels when the fan is in the on position, and a thermal mass positioned at a distance from the microprocessor. The microprocessor and thermal mass being thermally connected in a manner to transfer thermal energy from the microprocessor to the thermal mass. Operating the microprocessor, and conducting the heat produced from the microprocessor to the thermal mass reducing the operational time of the fan during microprocessor activity.

The foregoing has outlined the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

The foregoing and other features and aspects of the present invention will be best understood with reference to the following detailed description of a specific embodiment of the invention, when read in conjunction with the accompanying drawings, wherein.

Table 1 illustrates a time delay for activation of a fan for a 75 watt CPU utilizing a thermal mass.

DETAILED DESCRIPTION

Figure 1:
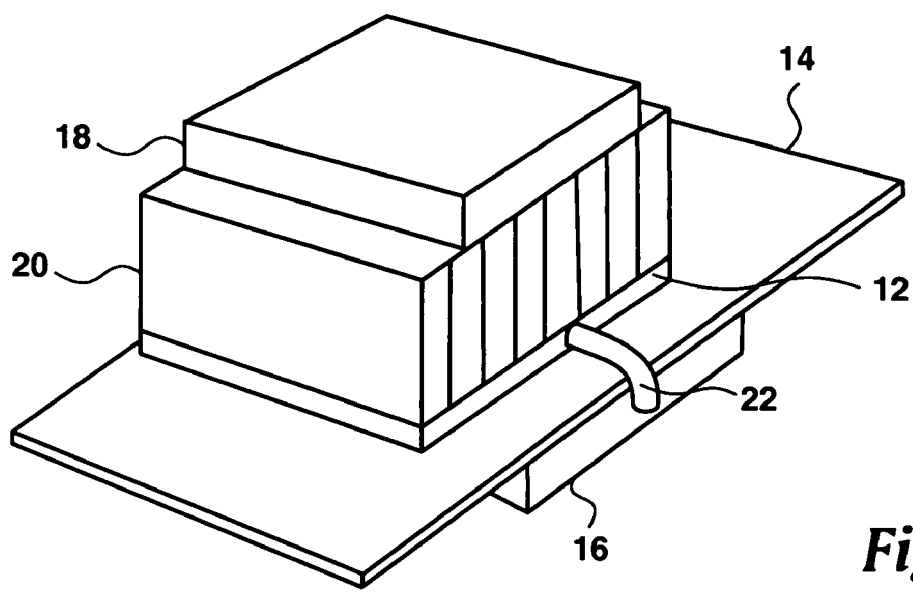
FIG. 1 is a schematic of an acoustic and thermal energy management system of the present invention.

Refer now to the drawings wherein depicted elements are not necessarily shown to scale and wherein like or similar elements are designated by the same reference numeral through the several views.

FIG. 1 is a schematic drawing of the acoustic and thermal energy management system of the present invention generally designated by the numeral 10. System 10 includes a central processing unit ("CPU") 12, or microprocessor identified as a CPU, a motherboard 14, and a thermal mass 16 connected to CPU 12 via a thermal coupler 22.

Figure 2:
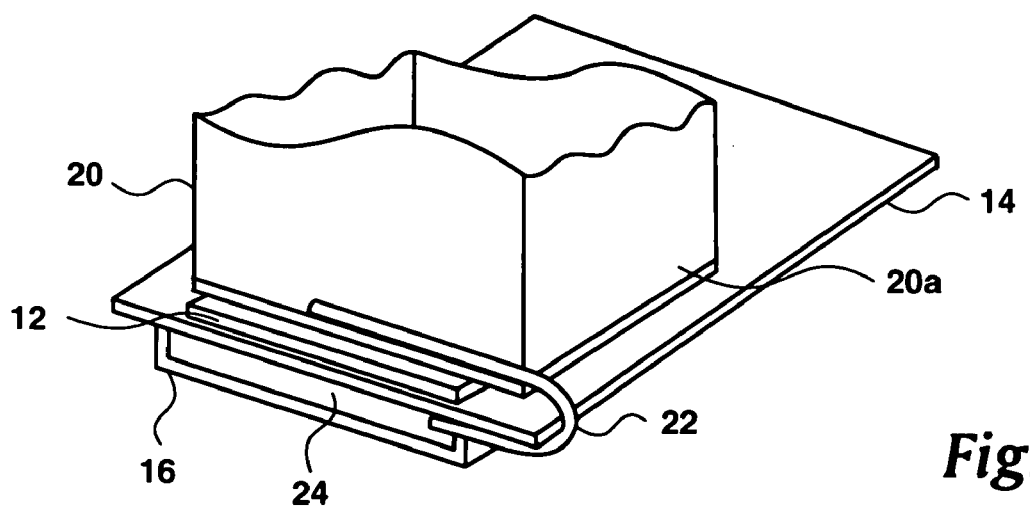
FIG. 2 a schematic of another embodiment of the acoustic and thermal management system of the present invention.
Figure 3:
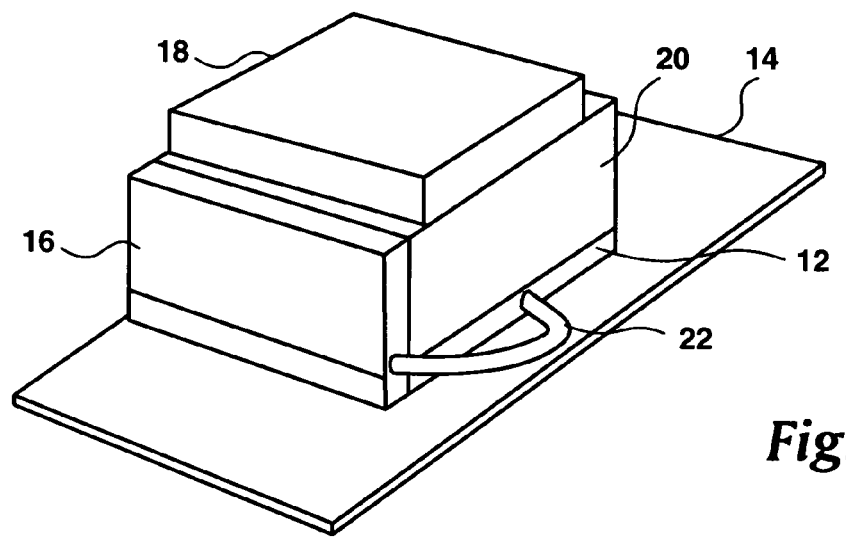
FIG. 3 is a schematic of another embodiment of the acoustic and thermal energy management system of the present invention.
Figure 4:
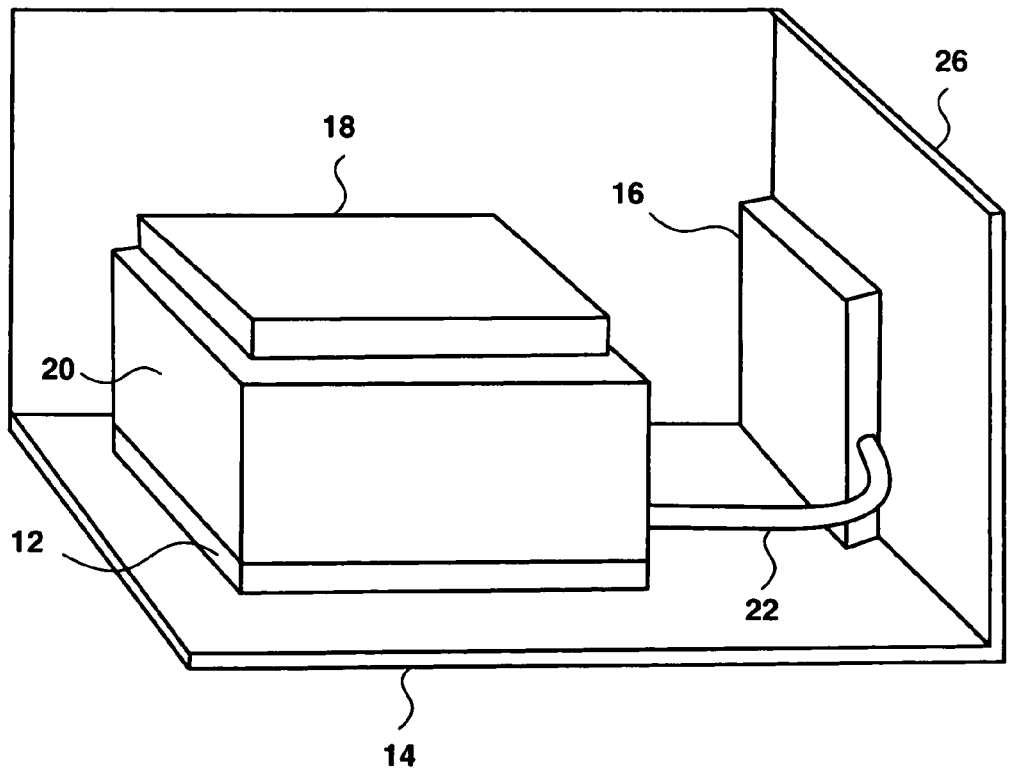
FIG. 4 is a schematic of another embodiment of the acoustic and thermal energy management system of the present invention.

The present invention may also include a fan 18 and a heat sink 20 that is known in the prior art. Typically heat sink 20 will have a heat sink base 20a which is shown in FIG. 2. FIG. 2 indicates that CPU 12 is contacting the heat sink 20 and is located below heat sink base 20a. As shown in FIGS. 1, 3, and 4 heat sink base 20a is included in heat sink 20 and not shown separately so that CPU 12, as the heat generating device, may be more clearly shown.

During process operations CPU 12 produces heat or thermal energy that must be removed from CPU 12 if the temperature of CPU 12 exceeds a determined temperature limit. In a typical utilization of system 10, CPU 12 does not continuously operate and the applications running do not stress CPU 12 to the maximum requiring extensive cooling of CPU 12. However, during peak operations, CPU 12 may exceed the determined temperature. In the prior art devices fan 18 will engage each time CPU 12 or the area proximate thereto exceeds the determined temperature. Thus, fan 18 engages intermittently to address short term temperature spikes proximate CPU 18. If the temperature of CPU 12 or proximate to CPU 12 continues to increase above the determined temperature the fan will increase in operational speed. This engagement of fan 18 and/or increase in operational speed of fan 18 creates noise and increases energy consumption.

The present invention provides a thermal mass 16 to hold and dissipate the heat produced from CPU 18 so that the determined temperature is not reached during operational processes and/or the determined temperature is not exceeded to the extent to increase the operational speed of fan 18. Thermal mass 16 is separate from other heat sinks 20 and fans 18.

Thermal mass 16 is a high density material that acts as a heat storage and dissipating the collected heat over time. For example, water as a thermal mass has a heat capacity of 1 Btu per pound-degree-Fahrenheit or 4.2 kilojoules per kilogram-degree-Kelvin. The heat capacity of system 10 is the mass of thermal mass 16 multiplied by the latent heat of the thermal mass 16 material.

Thermal mass 16 absorbs heat conducted from microprocessor 12, thus reducing the thermal energy of CPU 12 and the area proximate to CPU 12. This reduction in temperature at or proximate to CPU or microprocessor 12 reduces or eliminates the utilization of fan 18.

Thermal mass 16 may be a material that utilizes a phase change. An example of thermal mass 16 of the present invention is a bismuth alloy. Any substance known or conceived that will serve as a thermal mass are incorporated herein.

The heat generated by CPU 12 is drawn through thermal coupler 22, which is a thermally conductive member, to thermal mass 16 which is distanced from CPU 12. As shown in FIG. 1, thermal mass 16 is positioned away from CPU 12 and under motherboard 14 or on the opposing side of heat sink 20 and fan 18. A portion of the thermal energy produced by CPU 12 is conducted to and stored by thermal mass 16 for dissipation. The thermal energy stored by thermal mass 16 may be dissipated by radiation and/or convection.

FIG. 2 is a schematic of another embodiment of the acoustic and thermal management system of the present invention. Thermal mass 16 may form a cavity 24 for containing thermal mass material 16 that undergoes a phase change between liquid and solid. As illustrated, thermal mass 16 is in thermal conductive contact with CPU 12 via thermal coupler 22.

FIG. 3 is a schematic of another embodiment of the acoustic and thermal energy management system 10 of the present invention. In this embodiment thermal mass 16 is positioned proximate fan 18 and fan heat sink 20.

FIG. 4 is a schematic of another embodiment of the acoustic and thermal energy management system 10 of the present invention. In this embodiment thermal mass 16 is attached to a chassis wall 26. This embodiment improves the thermal energy dissipation from thermal mass 16 by facilitating heat transfer through natural convection with the exterior ambient conditions. This additional heat transfer by natural convection may allow further extraction of about 150 watts per area of thermal mass 16 for a moderate temperature rise from wall 26. This allows for an additional heat dissipation of 18 to 25 watts from the exposed surface of a small profile wall 26. This additional wattage may allow for CPU 12 power of up to 100 watts to be used with a time delay of approximately 22 minutes before fan 18 is activated. This ability to draw thermal energy from CPU 12 for dissipation at a remote location reduces the need to operate fan 18 or operate fan 18 for a substantial length of time or at a high operational level. Therefore, the operation of the electronic device requires less power over time and produces less noise.

Table 1 illustrates the time delay for activation of fan 18 for various exemplary grams of thermal mass 16 for a 75 watt CPU 12. As shown in Table 1, utilization of thermal mass 16 can significantly delay or avoid operation of fan 18 in a typical application. If it is necessary to operate fan 18, utilization of thermal mass 16 may alleviate the operation of fan 18 beyond the idle state thereby significantly reducing the noise level and energy consumption.

Figure 5:
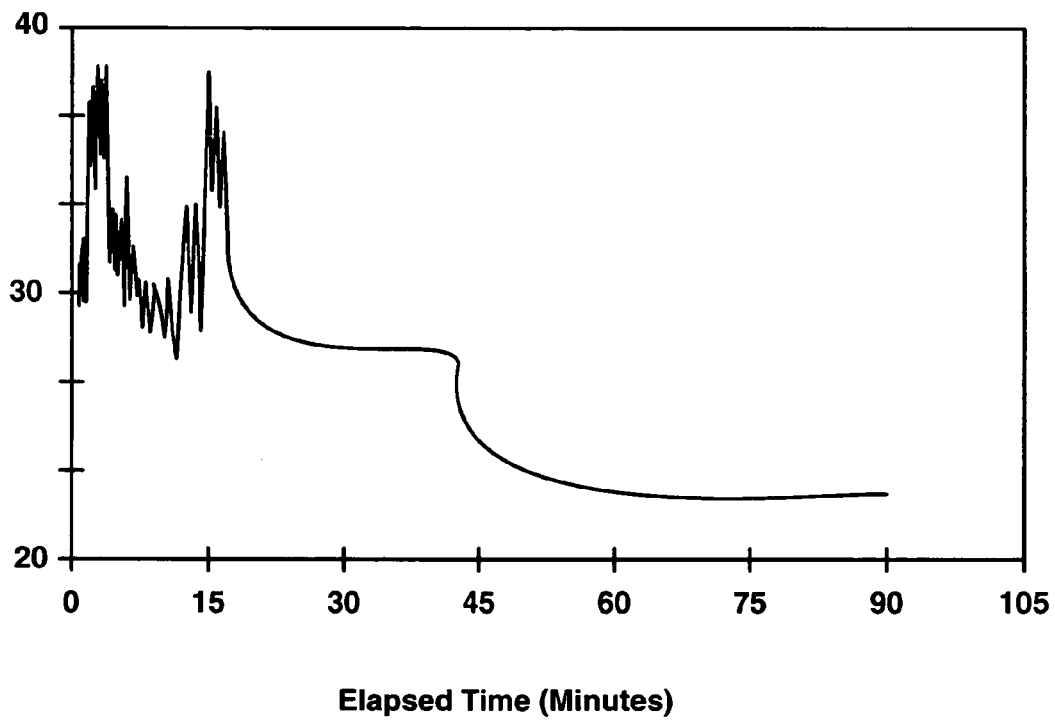
FIG. 5 is a graphical representation of a typical thermal profile of a CPU in a WINSTONE 2001 as tasks are run.

FIG. 5 is a CPU 12 thermal profile for a WINSTONE 2001 indicating the non-uniform power consumption profile when tasks are run, thus demonstrating the high probability that fan 18 will engage. The lack of steady state high power dissipation may create several scenarios where the power consumption is not at its high power state for a significant duration. This graph is exemplary of most uses of personal computing systems. Therefore the addition of system 10 of the present invention will limit and/or alleviate the operation of fan 18.

With reference to FIGS. 1 through 5 and Table 1, use of acoustic and thermal management system 10 is provided. A thermal mass 16 is positioned at a distance from the thermal energy producing CPU 12. Thermal mass 16 and CPU 12 are thermally connected by a thermal conductor 22 that conductively transfers heat from CPU 12 to thermal mass 16. Thermal mass 16 stores the energy and dissipates the thermal energy over time. This transfer of thermal energy from CPU 12 to thermal mass 16 provides a delay time before it is necessary to operate or increase the operation level of fan 18. This reduction in run time of fan 18 or operation level of fan 18 reduces the energy utilized for operation of CPU 12 and reduces the level of noise associated with operation of CPU 12. Typical use of a CPU 12 is intermittent including short periods of high activity separated by periods of substantial inactivity. System 10 facilitates the reduction and/or alleviation of operation of fan 18 by communicating the heat generated by CPU 12 to thermal mass 16 during CPU 12 operations.

From the foregoing detailed description of specific embodiments of the invention, it should be apparent that an acoustic and thermal energy management system that is novel has been provided. Although specific embodiments of the invention have been disclosed herein in some detail, this has been done solely for the purposes of describing various features and aspects of the invention, and is not intended to be limiting with respect to the scope of the invention. It is contemplated that various substitutions, alterations, and/or modifications, including but not limited to those implementation variations which may have been suggested herein, may be made to the disclosed embodiments without departing from the spirit and scope of the invention as defined by the appended claims which follow.

What is claimed is:

1. A cooling system for an electronic device comprising:
   a microprocessor connected to a motherboard;
   a heat sink positioned proximate the microprocessor;
   a fan functionally connected to the heat sink, the fan operational between an on and off position upon sensing a determined temperature of thermal energy proximate the microprocessor, wherein the fan is operational when the temperature proximate the microprocessor is greater than the determined temperature and the fan is static when the temperature proximate the microprocessor is less than the determined temperature, the fan further operational at various speed levels when the fan is in the on position; and
   a thermal mass functionally separate from the heat sink, the microprocessor and thermal mass being directly thermally connected by thermal connector to transfer thermal energy from the microprocessor to the thermal mass.

2. The system of claim 1, wherein the thermal mass is constructed of a material that changes physical phases.

3. The system of claim 1, wherein the thermal mass is constructed of a bismuth alloy.

4. A method for reducing time of operation of a fan in an electronic device having a heat sink positioned proximate a microprocessor and a fan functionally connected to the heat sink, the fan operating when the temperature proximate the microprocessor is greater than a determined temperature, the method comprising the steps of:
   thermally connecting a thermal mass to the microprocessor, the thermal mass being functionally separate from the heat sink; and
   conducting heat produced from the microprocessor to the thermal mass.

5. The method of claim 4, wherein the thermal mass is constructed of a material that changes physical phases.

6. The method of claim 4, wherein the thermal mass is constructed of a bismuth alloy.

7. The method of claim 4, wherein the thermal mass is connected to a chassis wall.

8. The method of claim 4, wherein the thermal mass is positioned on a side of a motherboard opposite the side of the motherboard proximate the positioning of the fan and the heat sink.

9. The meted of claim 7, wherein the thermal mass is constructed of a bismuth alloy.

10. The method of claim 8, wherein the thermal mass is constructed of a bismuth alloy.

11. The system of claim 1, wherein the thermal mass is connected to a chassis wall of the electronic device.

12. The system of claim 2, wherein the thermal mass is connected to a chassis wall of the electronic device.

13. The system of claim 3, wherein the thermal mass is connected to a chassis wall of the electronic device.

14. An acoustic and thermal management system for an electronic device having a heat sink positioned proximate a microprocessor and a fan functionally connected to the heat sink that operates when the temperature proximate the microprocessor is greater than a determined temperature, the system comprising:
   a thermal mass connected thermally to the microprocessor, the thermal mass functionally separate from the heat sink.

15. The system of claim 14, wherein the thermal mass is constructed of a material that changes physical phases.

16. The system of claim 14, wherein the thermal mass is constructed of a bismuth alloy.

17. The system of claim 14, wherein the thermal mass is connected to a chassis wall of the electronic device.

18. The system of claim 14, wherein the thermal mass is positioned on a side of a motherboard opposite the side of the motherboard proximate the positioning of the fan and the heat sink.

19. The system of claim 17, wherein the thermal mass is constructed of a material that changes physical phases.

20. The system of claim 18, wherein the thermal mass is constructed of a material that changes physical phases.

* * * * *

UNITED STATES PATENT AND TRADEMARK OFFICE
CERTIFICATE OF CORRECTION

| | |
|---|---|
| PATENT NO. | : 7,116,555 B2 |
| APPLICATION NO. | : 10/747569 |
| DATED | : October 3, 2006 |
| INVENTOR(S) | : Kamath et al. |

It is certified that error appears in the above-identified patent and that said Letters Patent is hereby corrected as shown below:

Claim 9, Column 6, line 26, delete "meted" and insert --method--.

Signed and Sealed this

Thirty-first Day of July, 2007

JON W. DUDAS
*Director of the United States Patent and Trademark Office*